United States Patent [19]
Maa et al.

[11] Patent Number: 4,648,939
[45] Date of Patent: Mar. 10, 1987

[54] FORMATION OF SUBMICROMETER LINES

[75] Inventors: Jer-shen Maa, Middlesex County, Plainsboro Township; Sheng M. Huang, Mercer County, Lawrenceville Township, both of N.J.

[73] Assignee: RCA Corporation, Princeton, N.J.

[21] Appl. No.: 845,585

[22] Filed: Mar. 28, 1986

[51] Int. Cl.⁴ .............. B44C 1/22; H01L 21/306; C23F 1/02; C03C 15/00
[52] U.S. Cl. .............................. 156/643; 156/646; 156/656; 156/657; 156/659.1; 156/662; 204/192.32
[58] Field of Search ............... 156/643, 646, 652, 653, 156/655, 656, 657, 659.1, 662; 204/192 EC, 192 E; 252/79.1; 427/38, 39

[56] References Cited

U.S. PATENT DOCUMENTS 4,547,261 10/1985 Maa et al. ..................... 156/643

OTHER PUBLICATIONS

Hatzakis et al., IBM J. Res. Develop., vol. 24, No. 4, pp. 452–460, 1980.
Hatzakis et al., J. Electrochem. Soc., vol. 116, No. 7, pp. 1033–1037, 1969.
Milgram, J. Vac. Sci. Technol. B, vol. 1, No. 2, pp. 490–493, 1983.
Bjorkolm et al., J. Applied Physics, vol. 57, No. 1, pp. 2402–2405, 1985.

Primary Examiner—William A. Powell
Attorney, Agent, or Firm—B. E. Morris; R. H. Swope

[57] ABSTRACT

The formation of elongated structures, such as lines, having a linewidth substantially less than one micrometer is described. An elongated structure of a first material having opposed sides, a rounded surface between the sides and a width typically of about one micrometer or greater is formed on a substrate. The sides of the structure are at least partially coated with a layer of a second material which will etch at a slower rate than the first material. The coating may completely cover the structure. The structure is anisotropically etched. Since the coating protects the sides of the structure, etching proceeds in the center to form two parallel lines, each significantly below one micrometer in width. In one embodiment, formation of the protective coating and etching of the structure are carried out simultaneously.

6 Claims, 9 Drawing Figures

FORMATION OF SUBMICROMETER LINES

This invention pertains to a method of forming elongated structures such as lines of material, e.g. conductive material, substantially less than one micrometer in width for semiconductor devices.

BACKGROUND OF THE INVENTION

The increasing demand for very-large-scale-integrated (VLSI) semiconductor devices has made imperative the development of lithographic techniques capable of producing patterns of one micrometer or less. At the present time, one micrometer is about the practical limit of linewidth that can be achieved photolithographically with accuracy and reproducibility. Linewidths less than one micrometer are being produced experimentally, however, particularly by X-ray lithography. The cost for equipment for X-ray lithography is exceptionally high, however.

In accordance with this invention, a technique has been found to produce elongated structures having a linewidth substantially below one micrometer utilizing presently available lithographic, e.g. photolithographic, techniques.

SUMMARY OF THE INVENTION

An elongated structure having a linewidth of one micrometer or more is anisotropically etched so that the center of the structure etches at a much greater rate than the lateral surfaces. Etching through to the substrate produces two elongated structures, each having a linewidth of less than one micrometer.

DETAILED DESCRIPTION OF THE INVENTION

An elongated structure of a first material having a particular geometry including a rounded upper surface and a linewidth generally of about one micrometer or greater is formed on a substrate. The structure is coated, at least on the lateral surfaces, with a thin layer of a second material, such as an oxide, which will etch at a lower rate than the first material. The structure is anisotropically plasma etched. If the structure is completely coated, etching will commence at the top wherein the coating is thinnest to the direction of the plasma. The structure is etched to the substrate, thus forming two equal and parallel submicrometer elongated structures as a result of the protective capacity of the coating on the outer surfaces. Alternatively, the structure is not initially coated. Etching in this instance is carried out in a plasma containing a component which forms a polymeric protective residue on vertical surfaces during etching.

The requisite elongated structures, e.g. lines, having a linewidth substantially less than one micrometer are formed in accordance with this invention by anisotropically plasma etching a first elongated structure having opposed sides and a rounded surface between the sides. The sides of the first elongated structure are tapered in relation to the substrate. A typical first elongated structure is a line of the desired material about one micrometer or greater in width. The linewidth of the first elongated structure can be less than one micrometer provided that such linewidth can be accurately and reproducibly formed. The submicrometer linewidths of this invention can be reproducibly formed only when the first elongated structure can be reproducibly formed.

Figure 1:
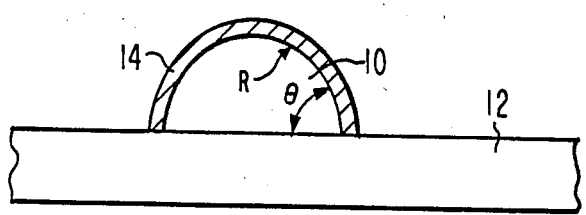
FIGS. 1 through 9 are cross-sectional views of a coated substrate showing the steps of the process of forming submicrometer lines on a substrate in accordance with this invention.

A typical first elongated structure to be etched in accordance with a preferred embodiment of this invention is a line shown in cross-section in FIG. 1. In FIG. 1, a line 10 of a first material is deposited on a suitable substrate 12. The line 10 has a rounded surface between opposed sides which has a radius of curvature R from about 100 to 500, preferably about 400, nanometers. The angle of taper of the sidewalls or lateral surfaces of the structure 10, theta, is between about 70° and 90°, preferably about 85°. The structure illustrated in FIG. 1 is completely coated with a thin layer 14 of a second material, such as an oxide, which etches at a lower rate, suitably a significantly lower rate, than the first material. While the vertical thickness of the structure 10 at its highest point can vary considerably, it will typically be from about 200 to 1500, suitably from about 600 to 1000, nanometers. The thickness of the coating 14 can vary from about 2 to 100, suitably from about 3 to 10, nanometers.

In theory, there is no upper limit to the linewidth of the first elongated structure, e.g. the line 10 in FIG. 1. As a practical matter, however, the shape of the structure 10, i.e. the radius of curvature and the angle of taper plus the vertical thickness combine to limit the linewidth. In general, the linewidth of the first elongated structure will not substantially exceed about three micrometers.

The structure illustrated in FIG. 1 having the requisite radius of curvature and angle of taper can be formed by a number of known techniques. For example, patterned film deposition by conventional lift-off technique will produce deposits having generally the desired configuration. Conventional lift-off technique, in essence, comprises forming a patterned structure on a substrate comprising one or more layers of material wherein the openings in the structure are larger at the substrate than at the structure surface, i.e. the pattern formed in the surface of the structure is undercut toward the substrate. A suitable material, commonly a metal, is then deposited over the substrate to a thickness such that the material deposited within the openings will separate from that deposited on the surface. The lift-off structure is removed with a suitable solvent which can penetrate to the substrate because of the undercut of the structure. When the material remaining on the substrate is a structure such as the line illustrated in cross-section in FIG. 1, the radius of curvature and the angle of taper will depend on a number of factors.

The deposition method and conditions inherent therein will influence the configuration of a structure formed by lift-off technique. For example, when the desired material is deposited by electron beam evaporation, the source/substrate geometry and their relative position will also influence the configuration of the structure 10. When the desired material is deposited by conventional sputtering techniques, the inert gas pressure in the deposition chamber as well as the substrate rotation, e.g. planetary rotation, will influence the configuration of the structure.

Figure 2:
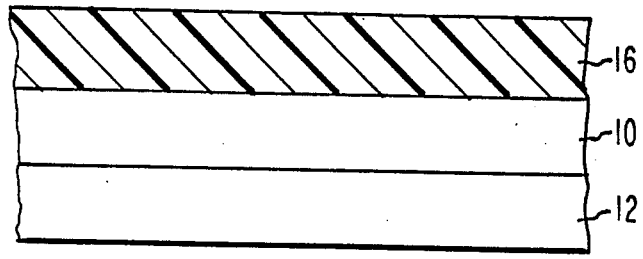
Figure 3:
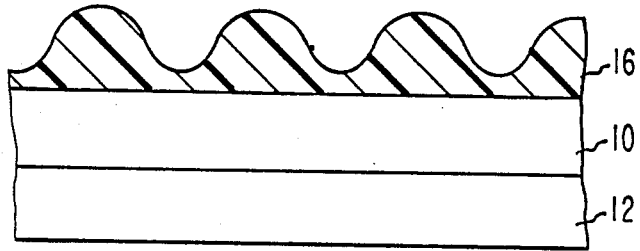
Figure 4:
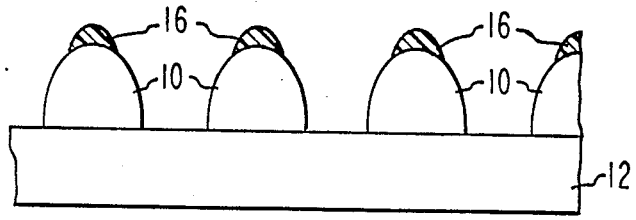

A second method of forming structures having the required configuration as shown in FIG. 1 is through the use of an undulating resist structure as illustrated in FIGS. 2 through 4. Referring to FIG. 2, a layer of the first material 10 and a layer of a suitable resist 16 are sequentially deposited on a substrate 12. The resist layer 16 is irradiated and developed to form an undulating or curved surface such as shown in FIG. 3. There are a number of conventional methods for producing the resist configuration shown in FIG. 3. For example, the resist layer may be under irradiated or out-of-focus irradiated and then wet developed, or patterned by laser holographic techniques utilizing Gaussian laser beams.

The structure shown in FIG. 3 is then anisotropically dry etched until most of the resist layer is removed, thus forming the structure shown in FIG. 4. The radius of curvature and the taper angle will depend on factors such as the resist profile, the relative erosion rates of the resist 16 and the layer 10, the plasma utilized and the like. These parameters are considered to be within the skill of the art. The remaining resist 16 is then removed, suitably with an organic solvent or an oxygen plasma. The structures formed from layer 10 may then be treated, for example by oxidation, to form the thin coating 14 as shown in FIG. 1.

Figure 5:
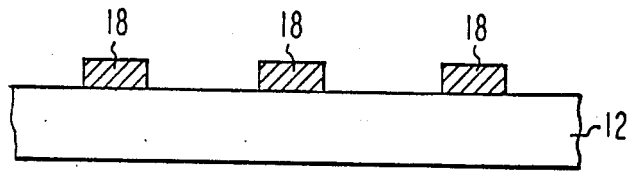
Figure 6:
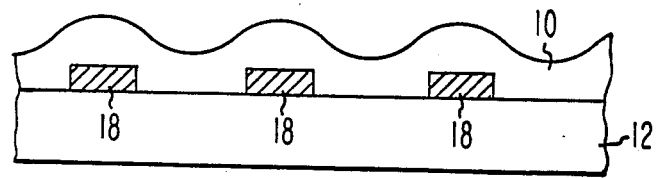
Figure 7:
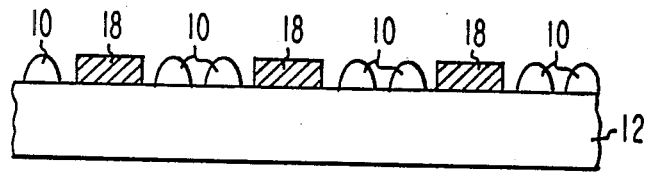

Still another method of forming the desired structures on a substrate is illustrated in FIGS. 5 through 7. In FIG. 5, a layer of a material, such as silicon dioxide, is lithographically patterned by conventional procedures to form a grating 18 as shown. A layer of the first material 10 which will form the structure to be etched in accordance with the subject process is deposited over the grating to form the structure shown in FIG. 6. The structure shown in FIG. 6 is anisotropically etched in a plasma which will etch layer 10, but have very little effect on the grating 18. There are formed isolated structures 10 having the desired configuration as shown in FIG. 7. As in the procedures discussed above, factors such as the plasma utilized, the thickness of the grating 18 and the layer 10 as well as the etch rate of the latter will determine the configuration of the structures 10 to achieve the desired radius of curvature and angle of taper. The grating 18 is removed, preferably by dry etching in an appropriate plasma which will have little effect on the structures 10.

The first material which comprises the structure 10 in FIG. 1 may be any material, conductive or nonconductive, which can be utilized in semiconductor device fabrication. Typical materials include amorphous or crystalline silicon which may be doped with a suitable impurity, silicon dioxide, various silicides, metals, such as aluminum or its alloys, or the like. The second material, which comprises the coating 14, is typically the oxide of the first material, but may be of any material which etches at a lower rate than the first material in the etching plasma. For example, a thin layer of a metal, such as aluminum, can be coated over a silicon dioxide structure, a layer of silicon nitride can be coated over a silicon structure, and the like. The layer 14 is suitably formed on the structure 10 by conventional techniques, such as oxidation, after the structure 10 has been formed by one of the above techniques or a comparable method.

Figure 8:
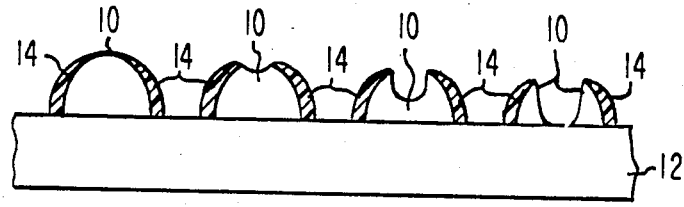

The structure shown in FIG. 1 is anisotropically dry etched in a suitable plasma which will etch the first material 10 at a substantially faster rate then the second material of the layer 14. FIG. 8 illustrates four such structures showing from left to right the progression of the etch. The layer 14 is initially removed on the top of the structure which then begins to etch toward the substrate 12. Etching will proceed at a much faster rate in the center of the structure, although some etching of the layer 14 will take place depending on the vertical thickness thereof to the direction of the etch. In the structure on the right in FIG. 8, the center has been etched to the substrate 12 and etching has been continued for a time sufficient to form two distinct and equal elongated structures from the original. The remainder of layer 14 can be removed by an appropriate wet or dry etching technique. In this way it is possible to accurately and reproducibly form structures, such as fine lines, having a width as small as 0.2 micrometer. It will be appreciated that the reproducible dimension of lines formed in accordance with this invention is directly related to how uniformly the original structure shown in FIG. 1 can reproducibly be formed by conventional techniques.

In an alternative embodiment of this invention, a structure having the requisite radius of curvature and angle of taper is anisotropically etched in an etch gas mixture containing a component which is known to cause the formation of a polymer during etching. During an anisotropic etch with such a mixture, the polymer deposited on horizontal or nearly horizontal surfaces is removed by the etch so that no accumulation occurs. As a surface becomes vertical, however, the rate of deposition of the polymer exceeds the removal due to the anisotropic nature of the etch. Such an etch mixture is disclosed by Maa et al. in U.S. Pat. No. 4,547,261, issued Oct. 15, 1985.

Figure 9:
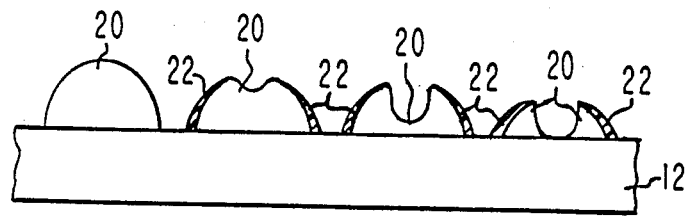

The etch mixture disclosed by Maa et al. is for the anisotropic etching of aluminum and comprises boron trichloride, nitrogen and a halogenated fluorocarbon, such as trichlorofluoromethane. Etching of an aluminum line in accordance with the subject method utilizing such an etch mixture is shown in FIG. 9. The progression of the etch is shown from left to right. As the center of the aluminum line 20 on the substrate 12 is etched, a polymeric residue 22 begins to deposit on the outer surfaces. It will be appreciated that, because there was no coating originally on the top of line 20, the profile of the two lines formed therefrom using such an etch mixture will be somewhat different from that produced by etching a structure having a protective coating over its upper surface. There will also be a greater loss in the thickness of the line 20 for the same reason. It will be further appreciated that the degree of polymer formation and the influence thereof on the wall profile of the structures being formed by the present method can be controlled by adjusting the amount of polymer-forming component in the etch mixture. Adjustment of an etch mixture such as disclosed by Maa et al. is considered to be within the level of skill in the art.

The process of this invention can be utilized to form submicrometer structures for semiconductor devices, for example, a submicrometer gate structure in n- or p-channel MOSFETs. The subject process is particularly suited to the formation of submicrometer diffraction gratings which cannot be obtained with present lithographic techniques due to the limit of resolution. It is also possible to mask one of the parallel lines formed in accordance with this invention with a resist material and etch the other thereby forming submicrometer connective lines for microcircuitry.

The invention has been described with reference to preferred embodiments thereof. It will be appreciated by those skilled in the art that various modifications may be made from the specific details given without departing from the spirit and scope of the invention.

We claim:

1. A process of forming a submicrometer structure of a first material on a substrate comprising:
    forming an elongated structure of the first material on the substrate, said structure having a width of about one micrometer or greater, opposed sides and a rounded surface between said sides, wherein the radius of curvature of the surface of the structure is from about 100 to 500 nanometers, and the angle of taper of the sides of the structure to the substrate is from about 70° to about 90°;
    forming on said structure a layer of a second material which etches at a slower rate than said first material, said layer at least partially covering the sides of said structure; and
    anisotropically etching said structure for a time sufficient to form two parallel elongated structures having exposed substrate between them.

2. A process in accordance with claim 1, wherein said layer of second material completely covers said structure.

3. A process in accordance with claim 2, wherein said layer of second material is formed by oxidizing said structure.

4. A process in accordance with claim 1, wherein said layer of second material is formed simultaneously with etching of the structure.

5. A process in accordance with claim 1, wherein said structure is formed on the substrate by providing a lift-off structure on the substrate, depositing a layer of the first material thereover and removing the lift-off structure.

6. A process in accordance with claim 1, additionally including the step of masking one of said parallel elongated structures and contacting the substrate with a suitable etchant to remove the other.

* * * * *